(12) United States Patent
Katohno

(10) Patent No.: US 6,583,689 B2
(45) Date of Patent: Jun. 24, 2003

(54) FOUR-POLE MONOLITHIC FILTER HELD IN A CONTAINER BY CONDUCTIVE ADHESIVES AT FOUR CONNECTING ELECTRODE LOCATIONS

(75) Inventor: Kazumi Katohno, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 29 days.

(21) Appl. No.: 10/017,448

(22) Filed: Dec. 18, 2001

(65) Prior Publication Data

US 2002/0075100 A1 Jun. 20, 2002

(30) Foreign Application Priority Data

Dec. 19, 2000 (JP) ........................................ 2000-384792

(51) Int. Cl.$^7$ ................................................ H03H 9/56
(52) U.S. Cl. ....................... 333/191; 333/189; 310/348; 310/366
(58) Field of Search ................................. 333/186–192; 310/348, 351–353, 366

(56) References Cited

U.S. PATENT DOCUMENTS

| | | | | |
|---|---|---|---|---|
| 4,365,181 A | * | 12/1982 | Yamamoto | .................. 310/320 |
| 5,572,082 A | * | 11/1996 | Sokol | ......................... 310/366 |
| 5,608,362 A | * | 3/1997 | Nishimura et al. | .......... 333/191 |
| 5,670,919 A | * | 9/1997 | Gamo | ......................... 333/189 |
| 5,939,956 A | * | 8/1999 | Arimura et al. | ............. 333/189 |

FOREIGN PATENT DOCUMENTS

| | | | | |
|---|---|---|---|---|
| JP | 58-139515 | * | 8/1983 | .................. 310/361 |
| JP | 6-6175 | * | 1/1994 | .................. 333/191 |
| JP | 9-46170 | | 2/1997 | |
| JP | 11-136087 | * | 5/1999 | |

* cited by examiner

Primary Examiner—Robert Pascal
Assistant Examiner—Barbara Summons
(74) Attorney, Agent, or Firm—Oblon, Spivak, McClelland, Maier & Neustadt, P.C.

(57) ABSTRACT

A surface mount type four-pole monolithic filter having two monolithic filter elements formed on a single rectangular crystal blank and connected in cascade, and being suppressed in its frequency change against the temperature change. The filter includes first and second connecting electrodes respectively formed at corners located at opposite ends of one diagonal line of the blank, and third and fourth connecting electrodes respectively formed in central portions of both long sides of the blank. The two filter elements are connected between the first and second connecting electrodes. The cascade connection point and the ground electrodes of the filter elements are led out to the third and fourth electrode, respectively. The first to fourth connecting electrodes are bonded, by means of conductive adhesive, to first to fourth holding electrodes formed in the container for surface mount for a mechanical holding as well as an electric conduction.

6 Claims, 3 Drawing Sheets

FOUR-POLE MONOLITHIC FILTER HELD IN A CONTAINER BY CONDUCTIVE ADHESIVES AT FOUR CONNECTING ELECTRODE LOCATIONS

BACKGROUND OF THE INVENTION

1. Field of the Invention

The present invention relates to a four-pole monolithic filter having two monolithic filter elements formed on a single piece of a piezoelectric blank.

2. Description of the Related Art

A monolithic filter is provided with a plurality of pairs of electrodes, which are formed in close proximity to one another on a single piezoelectric blank or plate in such a manner that a vibration mode of one vibrator is coupled to a vibration mode of the other vibrator so as to transmit a vibrating energy from one vibrator to the other vibrator thereby creating an acoustic coupling and transmitting only a vibration energy of desired frequency component. A crystal blank or crystal plate may, for example, be used as the piezoelectric blank. This type of monolithic filter has been widely used in recent years.

When the monolithic filter is requested to exhibit better attenuation or damping characteristic, as shown in FIG. 1, two monolithic filters 11 and 12 are connected in cascade, and a capacitor 13 halving a certain load capacitance is connected between the point of cascade connection of the two filters and an electric ground potential. For example, Japanese Laid-open Patent Publication (Kokai) No. Hei-9-46170 (JP, 09046170, A) discloses two monolithic filters, which are connected in cascade and encased in a single encasing container.

This JP, 09046170, A discloses a first example of two monolithic filters in cascade connection, in which two monolithic filters are separately formed on different piezoelectric blanks, and each of the piezoelectric blanks is fixed, at three corners thereof, to the encasing container by means of conductive adhesive. Further, the two filters are electrically connected in cascade to one another, and are also electrically connected to connecting terminals provide for the encasing container.

Nevertheless, in a monolithic filter employing a crystal blank as the piezoelectric blank and having a central frequency of approximately 80 MHz, especially in the small type monolithic filter, the size of the piezoelectric blank is of approximately 3 mm square. Therefore, there occurs such a problem that an accurate positioning of the two of such small piece of crystal blanks in place in the container and fixing thereof to the container are quite cumbersome in assembling while requiring a high production cost.

The above-mentioned JP, 09046170, A also discloses, as a second example having two monolithic filters in cascade connection. In the example, two couples of electrodes are formed on a single piece of piezoelectric blank so as to form two monolithic filter elements connected in cascade on the piezoelectric blank. In the disclosed filter, the piezoelectric blank is formed by a rectangular plate, and the piezoelectric blank is fixed at six positions, i.e., at four respective corners of the blank and at two respective central positions of the long sides of the rectangle, to the encasing container by means of conductive adhesive.

Nevertheless, in the case of such constructed filter, in order to adjust the attenuating characteristic of respective monolithic filter elements and also in order to connect a load capacitance to the connecting point of the series connection of the two filter elements, input and output electrodes must be led out separately for every one of the two filter elements. Accordingly, the number of terminals to be led out is five in total, including at least four at input and output electrodes and one at a grounded electrode. Further, if the ground electrode is led out from every one of the filter elements from the view point of making it easy to obtain a balanced condition in high frequency region, six electrodes in total must be led out of the two filter elements.

On the other hand, when the electrodes are led out of the blank, it is desired that a distance between respective two of the electrodes is as large as possible in order for avoiding unnecessary coupling of high frequency signals. Hereunder, any mutual couplings among the electrodes at a high frequency region can be reduced to the least possible extent to result in acquiring a good attenuating characteristic. Therefore, when six electrodes are led out, these electrodes are led out of six positions, i.e., the respective four corners of the crystal blank and the respective central positions of the two long sides of the blank.

The present inventor, as shown in FIG. 2, practically manufactured an example having two monolithic filter elements formed on a single piece of crystal blank, and conducted measurement of the characteristic of the example.

The manufactured filter is constructed in such a manner that on a rectangular crystal blank of 5 mm×2.5 mm extent, two monolithic filter elements 15 and 16 having a central frequency of approximately 80 MHz are formed, and that the two monolithic filter elements are connected in cascade so as to form a surface mount type four-pole monolithic filter. As will be understood from the illustration of FIG. 2, this filter is constructed so that crystal blank 14 is encased in box-like container 17. Crystal blank 14 is provided with six positions where electrodes are led out, and these electrodes are fixed to six holding electrodes 18 formed in six positions of the bottom face inside container 17 by means of conductive adhesive 19 so as to hold crystal blank 14 within container 17. A plurality of four-pole monolithic filters, each having the above-described construction, were manufactured and with the attenuating characteristic of each of the manufactured filters, measurement of a temperature characteristic at the central frequency was conducted. The result of the measurement is shown in FIG. 3.

As shown in FIG. 3, according to the prior art four-pole monolithic filter in which the crystal blank is held at its six positions by means of conductive adhesive, a change in the central frequency in the attenuating characteristic against a temperature change is very large with reference to the central frequency at the temperature of +25° C., when a change in the central frequency in the temperature range from −30° C. through +80° C. was measured, a change of approximately 35 to 80 ppm occurs at −30° C. particularly on a low temperature side, and a change on average was 50 ppm. This characteristic of the prior art four-pole monolithic filter obviously cannot satisfy the standard that is required for, for example, recent portable radio appliances, e.g., a portable telephone, with respect to the temperature change.

SUMMARY OF THE INVENTION

An object of the present invention is to provide a four-pole monolithic filter, which is small in its change in the central frequency in the attenuating characteristic against a temperature change and is able to acquire a stable characteristic.

The present inventor has conducted various studies to investigate a cause for the change in the central frequency of the above-described type four-pole monolithic filter. As a result, due to a difference in the factor of thermal expansion between the container made of ceramic and the crystal blank, a stress acts on the crystal blank via the conductive adhesive for the fixing of the crystal blank due to the temperature change, so that a phenomenon making it possible to assume that the change in the central frequency occurs by the affect of the action of the stress was founded. Thus, the present inventor has detected that a change in the central frequency versus a temperature change can be mitigated by reducing the number of supporting points of the piezoelectric blank such as a crystal blank, and accomplished the present invention.

In other words, the object of the present invention is attained by a four-pole monolithic filter having a constitution in which two sets of monolithic filter elements are formed on a single piezoelectric blank, the monolithic filter elements being electrically connected in cascade to one another, and comprising: a rectangular piezoelectric blank; a container for encasing therein the piezoelectric blank; first and second connecting electrodes respectively formed in first and second corners positioned on an identical diagonal line of the piezoelectric blank; first and second monolithic filter elements arranged to be mutually electrically connected in cascade between the first and second connecting electrodes on the piezoelectric blank; a third connecting electrode arranged at a central portion of a first long side of the piezoelectric blank for permitting a connecting point for the cascade connection of the first and second monolithic filter elements to be led out thereto; a fourth connecting electrode arranged at a central portion of a second long side of the piezoelectric blank for permitting ground electrodes of the first and second monolithic filter elements to be led out thereto; and first to fourth holding electrodes formed in the container to correspond to the first to fourth connecting electrodes, wherein the first to fourth connecting electrodes are respectively fixed to the first to fourth holding electrodes by means of conductive adhesive thereby holding the piezoelectric blank in the container and establishing electrical conduction of the respective first to fourth connecting electrodes to the first to fourth holding electrodes.

DETAILED DESCRIPTION OF THE INVENTION

Figure 4:
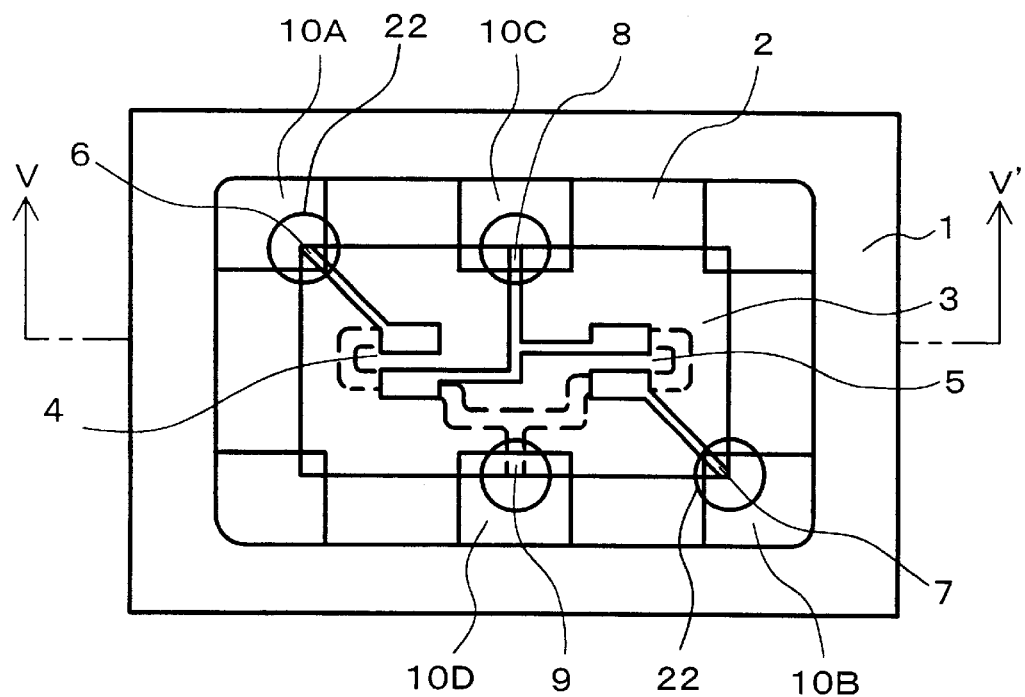
FIG. 4 is a plan view illustrating the construction of a four-pole monolithic filter according to a preferred embodiment of the present invention.
Figure 5:
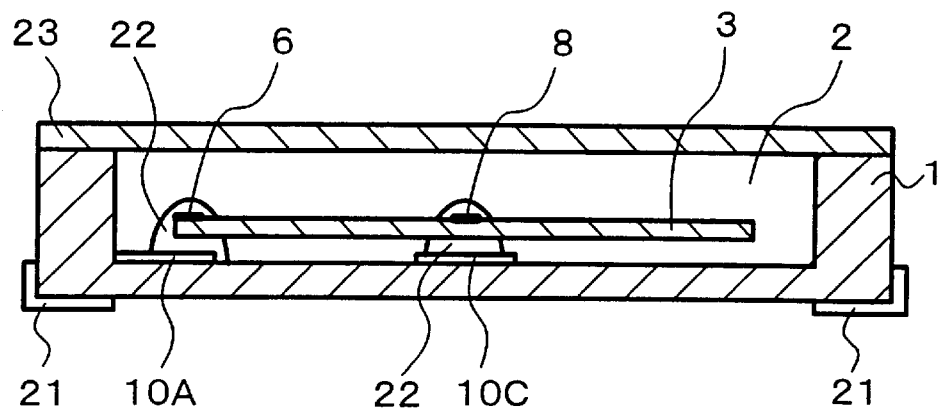
FIG. 5 is a view taken along the arrow line V—V' of FIG. 4.

A four-pole monolithic filter according to a preferred embodiment of the present invention, shown in FIGS. 4 and 5 employs rectangular crystal blank 3 as a piezoelectric blank. FIG. 4 depicts a state where lid 23 arranged on an upper opening of container 1 is removed.

This four-pole monolithic filter is provided with container 1 for surface mounting, which is made of, for example, ceramic and has the shape of a substantial rectangular parallelpiped (cuboid). The outer bottom face of container 1 is formed with at least four mounting terminals 21 used for electric connection with another circuit board and so on. Container 1 is provided with an upper face formed therein with a recess to be used as containing portion 2 for encasing crystal blank 3. Containing portion 2 is provided with an inner bottom face in which holding electrodes 10A to 10D are formed as described below.

Crystal blank 3 encased in containing portion 2 is an oblong crystal plate which is shaped from a material plate obtained by cutting a crystal of an artificial quartz at a predetermined angle with respect to the crystallographic axis thereof, and is provided with two sets of monolithic filter elements 4 and 5 formed thereon and connected to one another in cascade. A first connecting electrode 6 is formed at a first corner of crystal blank 3 and a second connecting electrode 7 is formed at a second corner of the blank, which is located at an opposite position to that of the first corner on an identical diagonal line. Further, at approximately central positions of two long sides of crystal blank 3, third and fourth connecting electrodes 8 and 9 are formed, respectively.

Two sets of monolithic filter elements 4 and 5 are arranged in such a manner that both are mutually connected in cascade at a position between first and second connecting electrodes 6 and 7. The position where monolithic filter elements 4 and 5 are mutually connected in cascade is led to third connecting electrode 8. The ground electrodes of respective monolithic filter elements 4 and 5 are commonly led out to fourth connecting electrode 9.

On the other hand, the bottom face of containing portion 2 of container 1 is provided with holding electrodes 10A to 10D formed therein, which are arranged so as to correspond to the above-mentioned first to fourth connecting electrodes 6 to 9, respectively. Holding electrodes 10A to 10D are respectively electrically connected to mounting electrodes 21 provided on the outer bottom face of container 1 via electric connecting portions (not shown).

First to fourth connecting electrodes 6 to 9 are respectively fixed to corresponding holding electrodes 10A to 10D by means of conductive adhesive 22, so that crystal blank 3 is encased in the interior of containing portion 2, and so that electrical connection is established between connecting electrodes 6 to 9 and holding electrodes 10A to 10D. Further, after adjustment of respective monolithic filter elements 4 and 5 for obtaining a predetermined characteristic, the upper opening of container 1 is covered with lid 23 made of a thin metallic plate, and lid 23 is secured to container 1 by means of the seam weld or the like, so that crystal blank 3 is hermetically sealed therein.

Figure 1:
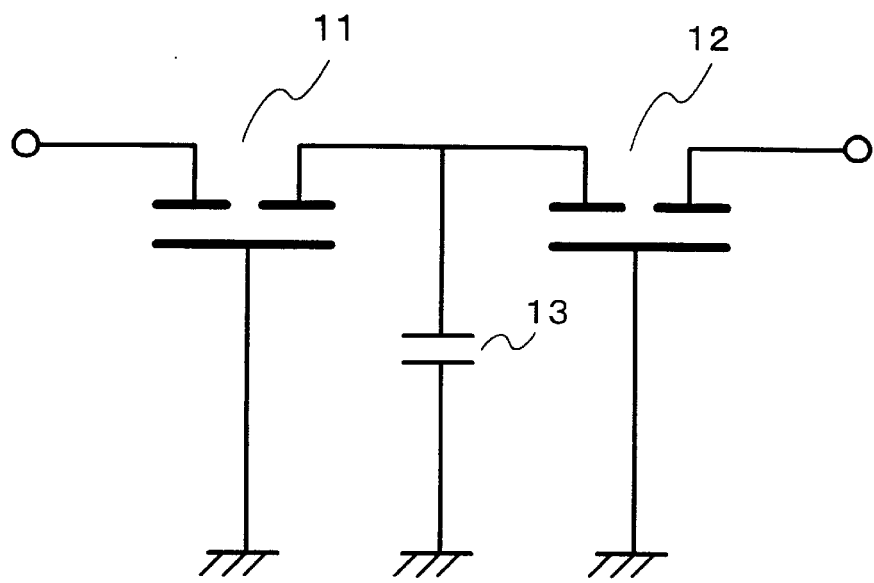
FIG. 1 is a circuit diagram of a four-pole monolithic filter.

In the four-pole monolithic filter having the above-described construction, since crystal blank 3 is supported at its four points, and fixed at the four points, degree of freedom in the construction of the filter can be larger than that of the prior art filter in which the crystal blank is supported and fixed at its six points. Therefore, this four-pole monolithic filter can reduce stress acting on the crystal blank due to a temperature change, in comparison with e.g., the prior art filter as shown in FIG. 1, and as a result, a change in the central frequency in the attenuating characteristic due to the temperature change can be reduced thereby resulting in acquirement of a stable characteristic.

Figure 2:
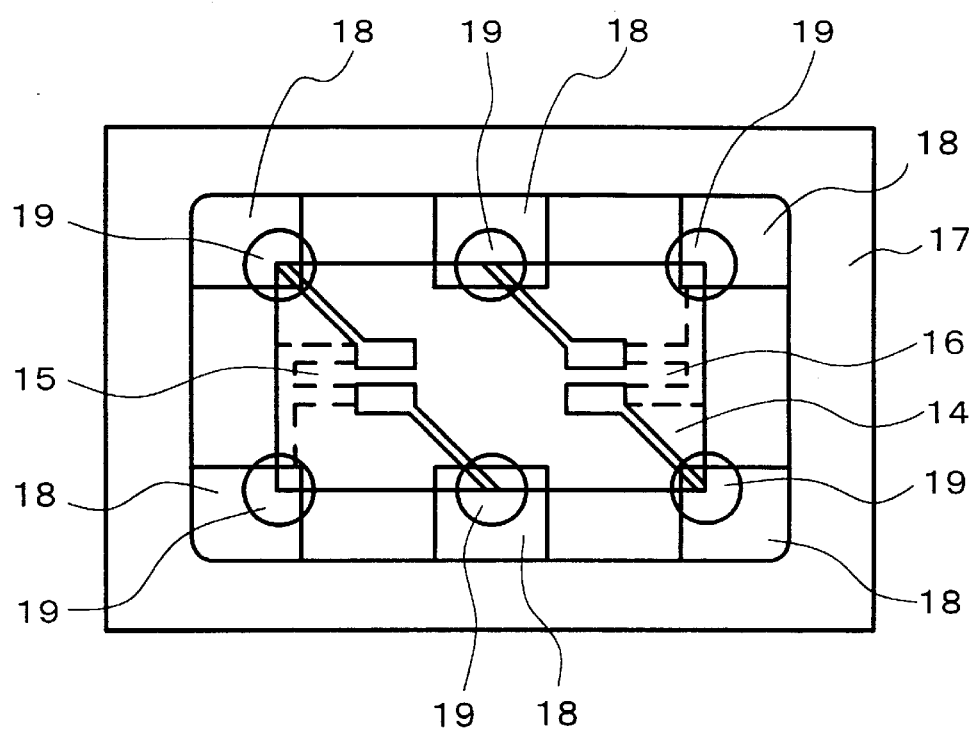
FIG. 2 is a plan view illustrating the construction of a four-pole monolithic filter according to the prior art.
Figure 3:
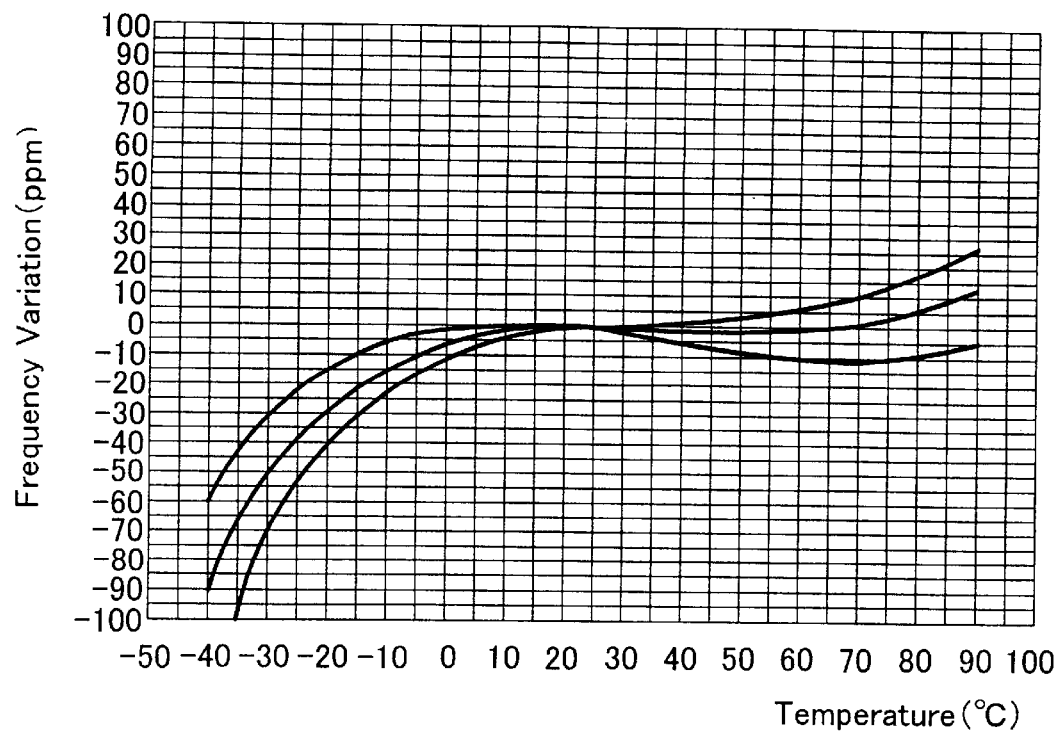
FIG. 3 is a graph indicating an example of the temperature characteristic of the four-pole monolithic filter shown in FIG. 2.

Now, the description of the temperature characteristic of the central frequency in the attenuating characteristic of the four-pole monolithic filter having the supporting structure as shown in FIGS. 4 and 5 will be provided hereinbelow, with reference to the result of the measurement of the temperature characteristic. At this stage, for the sake of easy comparison of the measured characteristic with the characteristic of the prior art filter, a crystal blank having the same dimension with that of one shown in FIG. 2 was employed for producing the measured four-pole monolithic filter of which the central frequency was adjusted to be the same as that of the filter of FIG. 2. The result of the measurement is illustrated in FIG. 6.

Figure 6:
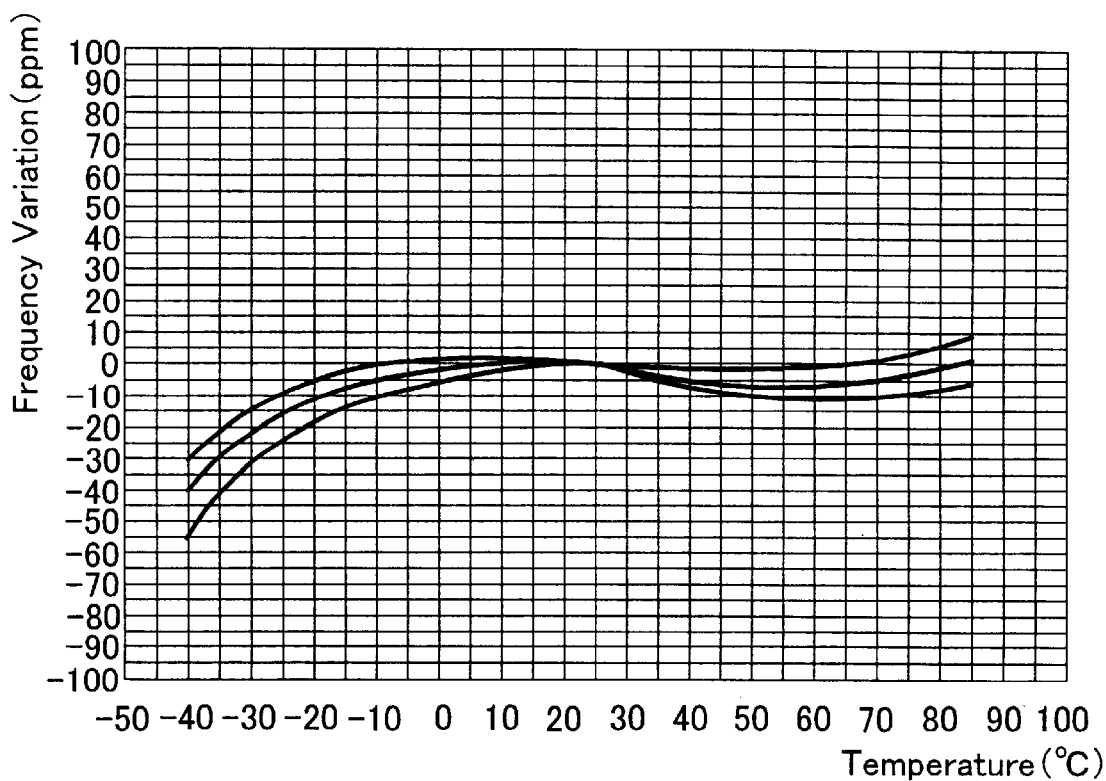
FIG. 6 is a graph indicating an example of the temperature characteristic of the four-pole monolithic filter shown in FIG. 4.

As illustrated in FIG. 6, the temperature characteristic of the four-pole monolithic filter according to this embodiment was good. When a change in the central frequency against a change in the temperature was measured in the temperature range between −30° C. to +80° C., the changing rate (frequency variation) of the central frequency at −30° C. on the low temperature side is between 15 to 32 ppm compared with the central frequency at +25° C., and the changing rate on average was 22 ppm. That is to say, the result of the measurement indicates that the changing rate of the central frequency of the four-pole monolithic filter of the present embodiment can satisfies the standard of ±30 ppm in the maximum changing rate of the central frequency against the temperature change, which is required for, for example, recent portable radio appliances.

What is claimed is:

1. A four-pole monolithic filter having the constitution in which two sets of monolithic filter elements are formed on a single piezoelectric plate, said monolithic filter elements being electrically connecting to one another in cascade, and comprising:

a rectangular piezoelectric plate;

a container for encasing therein said piezoelectric plate;

first and second connecting electrodes respectively formed in first and second corners positioned on an identical diagonal line of said piezoelectric plate;

first and second monolithic filter elements arranged to be mutually electrically connected in cascade between said first and second connecting electrodes on said piezoelectric plate;

a third connecting electrode arranged at a central portion of a first long side of said piezoelectric plate for permitting a connecting point for the cascade connection of said first and second monolithic filter elements to be led out thereto;

a fourth connecting electrode arranged at a central portion of a second long side of said piezoelectric plate for permitting ground electrodes of said first and second monolithic filter elements to be led out thereto; and first to fourth holding electrodes formed in said container to correspond to said first to fourth connecting electrodes, wherein said first to fourth connecting electrodes are respectively fixed to said first to fourth holding electrodes by means of conductive adhesive thereby holding said piezoelectric plate in said container and establishing electrical conduction of said respective first to fourth connecting electrodes to said first to fourth holding electrodes.

2. A four-pole monolithic filter according to claim 1, wherein said piezoelectric blank comprises a crystal blank.

3. A four-pole monolithic filter according to claim 2, wherein said container is made of ceramic.

4. A four-pole monolithic filter according to claim 3, wherein said container has a containing portion formed as a recess to encase said crystal blank.

5. A four-pole monolithic filter according to claim 4, further comprising a lid for covering an opening of said containing portion encasing therein said crystal blank to thereby hermetically seal said crystal blank.

6. A four-pole monolithic filter according to claim 4, wherein said container comprises a container for surface mount, which has the shape of a substantial rectangular parallelpiped.

* * * * *